United States Patent
Lifka et al.

(10) Patent No.: US 6,844,136 B1
(45) Date of Patent: Jan. 18, 2005

(54) PHOTOPOLYMERIZABLE MIXTURE AND RECORDING MATERIAL PREPARED THEREWITH

(75) Inventors: Thorsten Lifka, Aarbergen (DE); Sabine Kosack, Hattersheim (DE); Thomas Leichsenring, Mainz (DE); Hans-Joachim Schlosser, Wiesbaden-Naurod (DE)

(73) Assignee: AGFA-Gevaert (BE)

( * ) Notice: Subject to any disclaimer, the term of this patent is extended or adjusted under 35 U.S.C. 154(b) by 0 days.

(21) Appl. No.: 09/645,002

(22) Filed: Aug. 24, 2000

(30) Foreign Application Priority Data

Aug. 27, 1999 (DE) .......................... 199 40 921

(51) Int. Cl.$^7$ .................. G03C 1/735; G03F 7/027; G03F 7/028; G03F 7/09; G03F 7/032
(52) U.S. Cl. ................ 430/281.1; 430/284.1; 430/285.1; 430/273.1; 430/275.1; 430/277.1; 430/271.1; 430/279.1; 430/278.1; 430/306; 430/325; 430/905; 430/920; 430/925; 522/26; 522/29; 522/153; 522/160; 522/182
(58) Field of Search .................. 430/281.1, 284.1, 430/285.1, 273.1, 275.1, 306, 278.1, 277.1, 271.1, 279.1, 325, 905, 925, 920; 522/26, 29, 153, 160, 182

(56) References Cited

U.S. PATENT DOCUMENTS

| 3,856,885 A | * 12/1974 | Furuya et al. ............... 525/169 |
| 4,707,432 A | 11/1987 | Gatechair et al. ........... 430/281 |
| 5,049,479 A | 9/1991 | Zertani et al. .............. 430/271 |
| 5,229,253 A | 7/1993 | Zertani et al. .............. 430/281 |
| 6,306,557 B1 | * 10/2001 | Lin et al. ................. 430/288.1 |

FOREIGN PATENT DOCUMENTS

| EP | 0221010 | 5/1987 |
| EP | 0364735 | 4/1990 |
| EP | 0445624 | 9/1991 |
| EP | 0573805 | 12/1993 |

* cited by examiner

Primary Examiner—Mark F. Huff
Assistant Examiner—Sin J. Lee
(74) Attorney, Agent, or Firm—Connolly Bove Lodge & Hutz LLP

(57) ABSTRACT

This present invention discloses a photopolymerisable mixture comprising a polymer binder, a radically photopolymerisable component containing at least one photooxidisable group, a polyethylene glycol di(meth)acrylate containing 2 or more ethylene glycol units, a photoreducible dye and a metallocene. This mixture can be used for preparing high-speed light-sensitive recording materials showing a particularly high resolution, especially for small negative types.

21 Claims, No Drawings

PHOTOPOLYMERIZABLE MIXTURE AND RECORDING MATERIAL PREPARED THEREWITH

The present invention relates to a photopolymerisable mixture containing a polymer binder, a free-radically photopolymerisable component, a photoreducible dye and a metallocene. The present invention further relates to a recording material comprising a support and a layer of the photopolymerisable mixture. The recording material is in particular envisaged for the production of offset printing plates.

Photopolymerisable mixtures of the said kind are already known. EP-A 0 364 735 and EP-A 447 930, for example, disclose mixtures that contain apart from a polymer binder and a photopolymerisable compound a combination of a photoreducible dye, a trihalomethyl compound being cleavable by irradiation and a metallocene compound. The photopolymerisable compound is for example an acrylic ester or methacrylic ester of divalent or polyvalent alcohols. In a particularly preferred embodiment, the photopolymerisable compound is a (meth)acrylate of a divalent or polyvalent alcohol containing additionally at least one photooxidisable group and at least one urethane group in the molecule. The mixture is distinguished by its high speed, in particular in the visible spectral region. Recording materials prepared therewith are therefore particularly suitable for imaging with visible laser light such as laser light emitted by argon ion lasers (488 nm). EP-A 573 805 describes the possibility of further increasing the photosensitivity by reducing the binder proportion and increasing the metallocene part. In EP-A 445 624 dicyclopentadienyl-bis-(2,4,6-trifluorophenyl)titanium and zirconium are described to be very suitable metallocenes that contain mixtures showing high photosensitivity in the near ultraviolet region and in the visible region as well as a good thermal storage stability.

Efforts are directed to achieve an optimal speed of the recording material, so that low-cost lasers requiring only a minimum of maintenance can be used. However, this kind of lasers generally are low-energy lasers which can only be used for highly photosensitive materials. With the monomers containing photooxidisable groups on the other hand, the required high photospeed becomes achievable. However, they are poorly soluble in aqueous-alkaline developers thus impairing the developability of the areas of the negative-working photosensitive layer which are not or but only slightly exposed. In practice this disadvantage clearly manifests itself in that the development does not introduce a sufficient differentiation between image areas and non-image areas and poorly exposed parts of the non-image areas remain in the separating area between image areas and non-image areas after development on the plate. In particular in computer-to-plate halftone elements the halftone dots which have been developed on the plate have a bigger size than they should have according to the exposed dot area. As a result of this unexpected dot gain, negative types produced according to the computer-to-plate process and having a type size of less than 5 pt, for example, will not be reproduced openly.

The need therefore existed to provide a photopolymerisable mixture showing high sensitivity to ultraviolet and visible light and being in particular suitable for computer-to-plate laser recording materials. The recording material should above all show not or but only a markedly reduced dot gain after development, thus allowing also a true detail reproduction of small negative types. Moreover, the printing plates produced from the recording material should yield a long print run.

It has now been found that this objective can be accomplished using-a mixture of the kind mentioned hereinbefore, provided that, apart from a photopolymerisable compound containing one or more photooxidisable groups, it also contains a polyethylene glycol di(alk)acrylate containing at least 2 ethylene glycol units.

According to the present invention there is provided a photopolymerisable mixture comprising a polymer binder, a radically photopolymerisable component, a photoreducible dye and a metallocene and being characterised in that the photopolymerisable component contains at least one polymerisable compound possessing at least one photooxidisable group and at least one polyethylene glycol di(meth)acrylate containing 2 or more ethylene glycol units.

In a preferred embodiment, the mixture also contains a phthalocyanine pigment pre-dispersed with appropriate organic polymers.

The binder can be selected from a complete series of organic polymers. Mixtures of different binders can also be used. Useful binders include for example chlorinated polyalkylene (in particular chlorinated polyethylene and chlorinated polypropylene), poly(meth)acrylic acid alkyl esters or alkenyl esters (in particular polymethyl (meth)acrylate, polyethyl (meth)acrylate, polybutyl (meth)acrylate, polyisobutyl (meth)acrylate, polyhexyl (meth)acrylate, poly[(2-ethylhexyl)-(meth)acrylate] and poly[allyl(meth)acrylate], copolymers of (meth)acrylic acid alkyl esters or alkenyl esters with other copolymerisable monomers (in particular with (meth)acrylonitrile, vinyl chloride, vinylidene chloride, styrene and/or butadiene), polyvinyl chloride (PVC), vinyl chloride/acrylonitrile copolymers, polyvinylidene chloride (PVDC), vinylidene chloride/acrylonitrile copolymers, polyvinyl acetate, polyvinyl alcohol, polyacrylonitrile, acrylonitrile/styrene copolymers, (meth)acrylamide/alkyl (meth)acrylate copolymers, acrylonitrile/butadiene/styrene (ABS) terpolymers, polystyrene, poly(α-methylstyrene), polyamides, polyurethanes, polyesters, methyl cellulose, ethyl cellulose, acetyl cellulose, hydroxy-$(C_1$–$C_4)$-alkylcellulose, carboxymethyl cellulose, polyvinyl formal and polyvinyl butyral. Particularly suitable are binders that are insoluble in water, but on the other hand are soluble or at least swellable in aqueous-alkaline solutions. Further effective binders are polymers that are soluble in common organic coating solvents.

Particularly suitable for the purposes of the present invention are binders containing carboxyl groups, in particular copolymers containing units of α,β-unsaturated carboxylic acids or dicarboxylic acids (preferably acrylic acid, methacrylic acid, crotonic acid, vinylacetic acid, maleic acid or itaconic acid). Particular examples of useful copolymers are those containing units of (meth)acrylic acid and units of alkyl (meth)acrylates, allyl methacrylates and/or (meth) acrylonitrile as well as copolymers containing units of crotonic acid and units of alkyl (meth)acrylates and/or (meth)acrylonitrile and, finally, vinylacetic acid/alkyl (meth) acrylate copolymers. Also suitable are copolymers containing units of maleic anhydride or maleic acid monoalkyl esters. Among these are, for example, copolymers containing units of maleic anhydride and styrene, substituted styrenes, unsaturated ethers or esters or unsaturated aliphatic hydrocarbons and the esterification products obtained from such copolymers. Further suitable binders are products obtainable from the conversion of hydroxyl-containing polymers with intramolecular dicarboxylic anhydrides. By the term "copolymers" are to be understood in the context of the present invention polymers containing units of at least 2 different monomers, thus also terpolymers and higher mixed polymers. Further useful binders are polymers in which groups with acid hydrogen atoms are present, some or all of which are converted with activated isocyanates. Examples of these polymers are products obtained by conversion of hydroxyl-containing polymers with aliphatic or aromatic sulphonyl isocyanates or phosphinic acid isocyanates. Also suitable, finally, are polymers with aliphatic or aromatic hydroxyl groups, for example copolymers containing units of hydroxyalkyl (meth)acrylates, allyl alcohol, hydroxystyrene or vinyl alcohol, as well as epoxy resins, provided they carry a sufficient number of free OH groups, and also products obtained from the condensation of hydroxyl aromatics (in particular phenol, ortho-, meta- or para-cresol or a xylenol) with an aldehyde or ketone (in particular formaldehyde or acetone). Of the latter products, phenol/formaldehyde polycondensates, in particular novolaks, are particularly suitable.

By the term "(meth)acrylic acid" has to be understood in conjunction with the present invention "acrylic acid" and/or methacrylic acid". The same applies to (meth)acrylonitrile, —(meth)acrylate, —(meth)acrylamide etc.

The organic polymers used as binders show generally a mean molecular weight $M_w$ between 600 and 200,000, preferably between 1,000 and 100,000. Preference is further given to polymers having an acid number between 10 and 250, preferably between 20 and 200, or a hydroxyl number between 50 and 750, preferably between 100 and 500.

The amount of binder(s) generally ranges from 10 to 90% by weight, preferably from 30 to 80% by weight, relative to the total weight of the non-volatile components of the mixture.

The radically polymerisable compound comprising at least one photooxidisable group can also be selected from a complete series of compounds. A first group of suitable compounds are primary, secondary and in particular tertiary amino groups. Polymerisable compounds containing apart from a tertiary amino group at least one additional urea and/or urethane group are particularly preferred. By the term "urea group" has to be understood in the context of the present invention a group of the formula >N—CO—N< wherein the valences on the nitrogen atoms are saturated by hydrogen atoms and hydrocarbon radicals (a prime condition being that no more than one valence on either of the two nitrogen atoms is saturated by one hydrogen atom). However, it is also possible for one valence on one nitrogen atom to be bonded to a carbamoyl group (i.e. a —CO—NH— group), producing a biuret structure.

Also suitable are compounds containing a photooxidisable amino, urea or thio group, which may also be a constituent of a heterocyclic ring. Compounds containing photooxidisable enol groups can also be used. Concrete examples of photooxidisable groups are triethanolamino, triphenylamino, thiourea, imidazole, oxazole, thiazole, acetylacetonyl, N-phenylglycine and ascorbic acid groups. Particularly suitable compounds are monomers containing photooxidisable groups corresponding to the following formula (I):

$$R_{(n-m)}Q[(-CH_2-CR^1R^2-O)_a-CO-NH-(X^1-NH-CO-O)_b-X^2-(O-CO-CR^3=CH_2)_c]_n \quad (I)$$

wherein

| | |
|---|---|
| Q | denotes 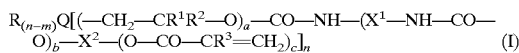 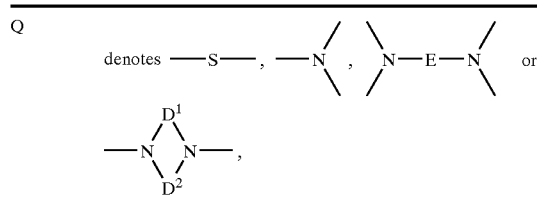 |
| R | represents a $(C_2-C_8)$ alkyl group, a $(C_2-C_8)$ hydroxyalkyl group or a $(C_6-C_{14})$ aryl group, |
| $R^1$ and $R^2$ | independently represent a hydrogen atom, an alkyl or alkoxyalkyl group, |
| $R^3$ | represents a hydrogen atom, a methyl or ethyl group, |
| $X^1$ | represents a straight-chained or branched saturated hydrocarbon group of 1 to 12 carbon atoms, |
| $X^2$ | represents a (c + 1)-valent hydrocarbon group in which up to 5 methylene groups may have been replaced by oxygen atoms, |
| $D^1$ and $D^2$ | independently represent a saturated hydrocarbon group of 1 to 5 carbon atoms, |
| E | denotes a divalent saturated hydrocarbon group of 2 to 12 carbon atoms, a divalent 5- to 7-membered, saturated iso- or heterocyclic group, which may contain up to 2 nitrogen, oxygen and/or sulphur atoms in the ring, a divalent aromatic mono- or bicyclic isocyclic group of 6 to 12 carbon atoms or a divalent 5- or 6-membered aromatic heterocyclic group, |
| a | is an integer from 0 to 4, |
| b | is 0 or 1, |
| c | is an integer from 1 to 3, |
| m | is an integer from 2 to 4 and |
| n | is an integer from 1 to m. |

Compounds of this nature and processes for their preparation are described extensively in EP-A 0 287 818. If a compound of general formula (I) contains several radicals R or several radicals according to the structure indicated between square brackets, i.e. if (n−m)>1 and n>1, these radicals can be identical or different from one another. Compounds according to formula (I), wherein n=m, are particularly preferred. In this case, all radicals contain polymerisable groups. Preferably, the index a=1; if several radicals are present, a=0 may apply in not more than one radical. If R is an alkyl or hydroxyalkyl group, R generally contains 2 to 8, particularly 2 to 4 carbon atoms. Aryl radicals R are in general mononuclear or binuclear, preferably however mononuclear, and may be substituted with $(C_1-C_5)$ alkyl or $(C_1-C_5)$ alkoxy groups. If $R^1$ and $R^2$ are alkyl or alkoxy groups, they preferably contain 1 to 5 carbon atoms. $R^3$ is preferably a hydrogen atom or a methyl group. $X^1$ is preferably a straight-chained or branched aliphatic and/or cycloaliphatic radical of preferably 4 to 10 carbon atoms. In a preferred embodiment, $X^2$ contains 2 to 15 carbon atoms and is in particular a saturated, straight-chained or branched aliphatic and/or cycloaliphatic radical containing this amount of carbon atoms. Up to 5 methylene groups in these radicals may have been replaced by oxygen atoms. In the case of $X^2$ being composed of pure carbon chains, the radical generally has 2 to 12 carbon atoms, preferably 2 to 6 carbon atoms. $X^2$ can also be a cycloaliphatic group of 5 to 10 carbon atoms, in particular a cyclohexane diyl group. The saturated heterocyclic ring formed by $D^1$, $D^2$ and both nitrogen atoms generally has 5 to 10 ring members, in particular 6 ring members. In the latter case the heterocyclic ring is accordingly preferably a piperazine and the radical derived therefrom a piperazine-1,4-diyl radical. In a preferred embodiment, radical E is an alkane diyl group which normally contains about 2 to 6 carbon atoms. Preferably the divalent 5- to 7-membered, saturated, isocyclic group E is a cyclohexane diyl group, in particular a cyclohexane-1,4-diyl group. The divalent, isocyclic, aromatic group E is preferably an ortho-, meta- or para-phenylene group. The divalent 5- or 6-membered aromatic heterocyclic group E, finally, contains preferably nitrogen and/or sulphur atoms in the heterocyclic ring. c is preferably 1, i.e. each radical in the square bracket generally contains only one polymerisable group, in particular only one (meth)acryloyloxy group.

The compounds of formula (I) wherein b=1, which accordingly contain two urethane groups in each of the radicals indicated in the square bracket, can be produced in a known way by conversion of acrylic esters or alkacrylic esters which contain free hydroxyl groups with equimolar amounts of diisocyanates. Excess isocyanate groups are then, for example, reacted with tris(hydroxyalkyl)amines, N,N'-bis(hydroxyalkyl) piperazines or N,N,N',N'-tetrakis (hydroxyalkyl) alkylenediamines, in each of which individual hydroxyalkyl groups may have been replaced by alkyl or aryl groups R. If a=0, the result is a urea grouping. Examples of the hydroxyalkylamine starting materials are diethanolamine, triethanolamine, tris(2-hydroxypropyl) amine, tris(2-hydroxybutyl)amine and alkyl-bis-hydroxyalkylamines. Examples of suitable diisocyanates are hexamethylene diisocyanate, 2,2,4-trimethylhexamethylene diisocyanate, 1,4-cyclohexylene diisocyanate (=1,4-diisocyanatocyclohexane) and 1,1,3-trimethyl-3-isocyanatomethyl-5-isocyanato-cyclohexane. The hydroxyl-containing esters used are preferably hydroxyethyl (meth) acrylate, hydroxypropyl (meth)acrylate and hydroxyisopropyl (meth)acrylate.

The polymerisable compounds of formula (I) wherein b=0 are prepared by converting the above-described hydroxy-alkylamino compounds with isocyanate-containing acrylic or alkacrylic esters. A preferred isocyanate-containing ester is 2-isocyanato-ethyl (meth)acrylate.

Further polymerisable compounds comprising photooxidisable groups suitable for the purposes of the invention are compounds according to formula (II)

$$R_{(n-m)}Q[(-CH_2-CR^1R^2-O)_{a'}-(CH_2-CH[CH_2-O-CO-CR^3=CH_2])-O)_{b'}-H]_n \quad (II)$$

wherein a' and b' represent integers from 1 to 4 and Q, R, $R^1$, $R^2$, $R^3$, n and m have the same meaning as above and Q can also be a group of the formula >N—E'—N< wherein the radical E' corresponds to formula. (III)

$$-CH_2-CH(OH)-CH_2-[O-(p)C_6H_4-C(CH_3)_2-(p)C_6H_4-CH_2-CH(OH)-CH_2-]_c \quad (III)$$

wherein c has the same meaning as in formula (I) and $(p)C_6H_4$ represents para-phenylene.

The compounds of formula (II) are prepared analogously to those of formula (I), except that the conversion products of hydroxyalkyl acrylates or alkacrylates and diisocyanates are replaced by the corresponding acrylic and alkacrylic glycide esters. Compounds of formula (II) and processes for their preparation are disclosed in EP-A 0 316 706.

Further useful polymerisable compounds containing photooxidisable groups are acrylic and alkacrylic esters of formula (IV).

$$Q'[(-X^{1'}-CH_2-O)_a-CO-NH(-X^1-NH-CO-O)_b-X^2(-O-CO-CR^3=CH_2)]_n \quad (IV)$$

wherein

Q 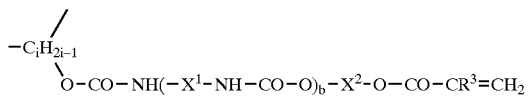

denotes $X^{1'}$ represents $-C_iH_{2i}-$ or

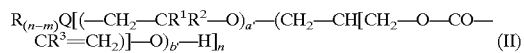

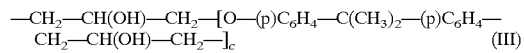

D³ represents a saturated hydrocarbon group of 4 to 8 carbon atoms, which together with the nitrogen atom forms a 5- or 6-membered heterocyclic ring, Z represents a hydrogen atom or a radical of the formula
$C_kH_{2k}-O-CO-NH(-X^1-NH-CO-O)_b-X^2-O-CO-CR^3=CH_2$ i and k independently represent integers from 1 to 12 and n' represents an integer from 1 to 3.

a being 0 in at least one of the radicals bonded to Q.

$X^1$, $R^3$, a and b have the same meaning as given in the above formula (IV), $X^2$ represents a divalent hydrocarbon group in which up to 5 methylene groups may be replaced by oxygen atoms. In this formula index a is preferably 0 or 1 and i preferably represents a number between 2 and 10. Preferred radicals Q are piperazine-1,4-diyl ($D^1=D^2=CH_2-CH_2$), piperidine-1-yl ($D^3=[CH_2]_5$, Z=H) and 2-(2-hydroxyethyl)-piperidine-1-yl ($D^3=[CH_2]_5$, Z=$CH_2-CH_2OH$).

Of the compounds of formula (IV), those which apart from a urea group contain at least one urethane group are preferred. Here again, by the term "urea group" has to be understood the group of again, by the term "urea group" has to be understood the group of formula >N—CO—N< already mentioned above. Compounds of formula (IV) and processes for their preparation are disclosed in EP-A 0 355 387.

The amount of polymerisable compound comprising photooxidisable groups generally ranges from 5 to 75% by weight, preferably from 10 to 65% by weight, relative to the total weight of the non-volatile components of the mixture.

The polyethylene glycol di(meth)acrylate contains at least 2, preferably 3 to 5 ethylene glycol units. Preference is given to di(meth)acrylates of polyethylene glycols having an average molecular weight of about 200 to 400. These include particularly diethylene glycol, triethylene glycol and tetraethylene glycol di(meth)acrylate. The amount of polyethylene glycol di(meth)acrylate generally ranges from 5 to 75% by weight, preferably from 10 to 65% by weight, relative to the total weight of the non-volatile components of the mixture in accordance with the present invention.

Moreover, the mixture can contain polyfunctional acrylate or alkacrylate compounds as crosslinking agents. These compounds are compounds containing more than 2, preferably between 3 and 6 acrylate and/or alkacrylate groups. These include in particular (meth)acrylates of saturated aliphatic or alicyclic trivalent or polyvalent alcohols such as trimethylol ethane, trimethylol propane, pentamethylol propane, pentaerythritol or dipentaerythritol.

Moreover, the mixture in accordance with the present invention may contain conversion products of monoisocyanates or diisocyanates containing polyhydric alcohols in which a part of the hydroxyl groups has been esterified with (meth)acrylic acid. Preferred products are those obtained from the conversion of hydroxyalkyl (meth)acrylates with diisocyanates. Such monomers are known and are described, for example, in DE-A 28 22 190.

The total amount of all polymerisable compounds generally ranges from about 10 to 90% by weight, preferably from about 20 to 80% by weight, relative to the total weight of the non-volatile components of the mixture of the present invention.

The mixture in accordance with the present invention additionally contains at least one photoreducible dye. Preference is given to xanthene, benzoxanthene, benzothioxanthene, thiazine, pyronine, porphyrine or acridine dyes. Suitable xanthene and thiazine dyes are disclosed, for example, in EP-A 0 287 817. Suitable benzoxanthene and benzothioxanthene dyes are disclosed in EP-A 0 321 828. A particularly suitable porphyrine dye is, for example, hematoporphyrine-IX, and a suitable acridine dye is, for example, acriflavinium chloride hydrochloride. Examples of xanthene dyes are Eosine B (C.I. No. 45 400), alcohol-soluble Eosine (C.I. 45 386), yellowish Eosine (C.I. No. 45 380), methyl Eosine (C.I. 45 385), Cyanosine (C.I. No. 45 410), Bengal Rose (C.I. 45 440), Erythrosine (Acid Red 51; C.I. No. 45 430), 2,3,7-trihydroxy-9-phenylxanthenone, Rhodamine 6G (C.I. No. 45 160) and Rhodamine B (C.I. 45 170). Examples of thiazine dyes are Thionine (C.I. No. 52 000), Azure A (C.I. No. 52 005) and Azure C (C.I. No. 52 002). Examples of pyronine dyes are Pyronine B (C.I. No. 45 010) and Pyronine GY (C.I. 45 005). Particularly suitable eosine dyes are eosine esters comprising generally straight-chained ($C_3$–$C_{18}$) alkyl radicals in the alcohol part.

The amount of photoreducible dye generally ranges from about 0.01 to 10.0% by weight, preferably from about 0.05 to 4.0% by weight, relative to the total weight of the non-volatile components of the photopolymerisable mixture.

The metallocenes that can be used as photoinitiator constituent in the mixture in accordance with the present invention are known as such. Most of these compounds are also known for use as photoinitiators or constituents of photoinitiator combinations, as disclosed e.g. in U.S. Pat. No. 3,717,558 and U.S. Pat. No. 4,707,432. Preference is given to metallocenes comprising elements of Subgroup IV of the Periodic Table, in particular compounds of titanium and zirconium. Compounds of this class are described in EP-A 318,893; EP-A 318,894; EP-A 401,165 and EP-A 401,166. Among the wide variety of metallocenes known, in particular titanocenes, compounds corresponding to the general formula (V) are preferred:

(V)

wherein Me represents a metal atom capable of forming four complex bonds, in particular titanium or zirconium; $R^4$ and $R^5$ represent cyclopentadienyl radicals which may be substituted identically or differently; and $R^6$ and $R^7$ represent phenyl radicals which independently of the $R^4$ and $R^5$ radicals may be also substituted identically or differently. Preferably, the cyclopentadienyl radicals are substituted with chlorine atoms, alkyl groups of 1 to 4 carbon atoms, cycloalkyl groups of 5 to 7 carbon atoms (in particular cyclohexyl groups) or aryl groups of 6 to 10 carbon atoms (in particular phenyl groups). The cyclopentadienyl groups may be linked to one another by alkylene groups. $R^6$ and $R^7$ are preferably phenyl groups substituted with a fluorine atom in either of the two o-positions (i.e. the positions contiguous to the bond to the metal). Alternatively or in addition, the phenyl radicals may be substituted with halogen atoms, such as F, Cl and/or Br, by alkyl groups of 1 to 4 carbon atoms, alkoxy groups of 1 to 4 carbon atoms, aryl groups of 6 to 10 carbon atoms, heteroaryl groups of 4 to 9 carbon atoms (the latter groups usually comprise O, S and/or N atoms as aromatic nucleus members). Further suitable substituents include polyoxyalkylene groups, the terminal hydroxyl groups of which may be etherified or esterified by an alkyl or acyl radical of 1 to 18 carbon atoms. In general, these groups contain 1 to 6 oxyalkylene units, in particular ethylene glycol or propylene glycol units and, advantageously, are located in the p-position of the bond to the metal.

Particularly preferred are metallocenes in which $R^4$ and $R^5$ represent cyclopentadienyl groups which may be substituted and $R^6$ and $R^7$ represent tetra- or pentafluorophenyl groups or a group according to formula (VI)

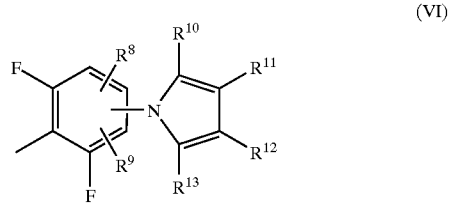

(VI)

wherein
$R^8$ and $R^9$ represent independently a hydrogen or fluorine atom,
$R^{10}$ to $R^{13}$ represent independently a hydrogen, fluorine, chlorine atom or bromine atom, an alkyl group of 1 to 12 carbon atoms, an alkoxy group of 1 to 12 carbon atoms, a polyoxyalkylene group or a polyoxyalkylene group being etherified by an alkyl group of 1 to 18 carbon atoms or esterified by an acyl group of 1 to 18 carbon atoms.

A particularly preferred titanocene of formula (V) is bis($\eta^5$-cyclopentadienyl)-bis-pentafluorophenyltitanium, a particularly preferred titanocene of formula (VI) being bis-($\eta^5$-cyclopentadienyl)-bis-(2,6-difluoro-3-pyrrol-1-yl-phenyl)titanium wherein $\eta$ indicates the hapticity (cyclopentadiene is a pentahapto ligand).

The amount of metallocene(s) generally ranges from about 0.01 to 20% by weight, preferably from 0.05 to 12% by weight, relative to the total weight of the non-volatile components of the photopolymerisable mixture.

Optional predispersed phthalocyanine pigments are primarily envisaged for dyeing the mixture and the layers produced therewith. Their amount generally ranges from about 1 to 10% by weight, preferably from about 2 to 7% by weight. Particularly suitable predispersed phthalocyanine pigments are disclosed in unpublished DE-A 199 15 717 and DE-A 199 33 139. Preference is given to metal-free phthalocyanine pigments.

In order to increase the photosensitivity, the mixture according to the invention may contain further photoinitiators. Such coinitiators include e.g. a compound containing at least one trihalomethyl group, which can be cleaved photolytically, in particular a trichloromethyl or a tribromomethyl group. Compounds of this class are also known. The trihalomethyl groups may be linked to an aromatic carbocyclic or heterocyclic nucleus either directly or through a conjugated double bond or through a chain of conjugated double bonds. Preferred compounds are those containing a triazine nucleus in the basic structure, which preferably carries 2 trihalomethyl groups as disclosed in e.g. EP-A Nos. 137,452 and 563,925. These compounds exhibit strong light absorption in the UV/VIS spectral range from 300 to 500 nm. Also suitable are compounds comprising trihalomethyl groups that even absorb only little, or not at all in the spectral range of the imaging radiation applied, such as e.g. trihalomethyl triazines which contain (saturated)

aliphatic substituents or unsaturated substituents having relatively short mesomerism-capable π-electron systems. Compounds having another basic structure, but which absorb in the shorter-wave UV range, such as phenyl trihalomethyl sulphones, in particular phenyl tribromomethyl sulphone, and phenyl trihalomethyl ketones are principally also suitable. In general, the amount of the halomethyl compounds ranges from 0.01 to 4.0% by weight, preferably from 0.05 to 1.0% by weight, with respect to the total weight of non-volatile matter of the photopolymerisable mixture.

Finally, the mixture according to the invention may contain an acridine, phenazine and/or quinoxaline compound as a further initiator constituent. These compounds are already described in e.g. DE-A 20 27 467 and DE-A 20 39 861. By adding these compounds, the sensitivity of the mixture is increased, especially in the near UV range. Suitable representatives of this class of compounds are 9-substituted acridines, such as 9-phenyl, 9-(4-methoxyphenyl) and 9-acetylaminoacridine, or acridine derivatives containing fused aromatic nuclei, e.g. benzo[a]acridine. A particularly suitable phenazine derivative is e.g. 9,10-dimethylbenzo[a]phenazine. Suitable quinoxaline derivatives are, in particular, the 2,3-diphenyl derivatives which are preferably further substituted in the phenyl radicals by methoxy groups. In general, the acridine derivatives are preferred. The amount of the acridine, phenazine or quinoxaline compound (s) in the mixture ranges from 0.01 to 4.0% by weight, preferably from 0.05 to 1.0% by weight, with respect to the total weight of non-volatile matter of the photopolymerisable mixture.

Further suitable coinitiators are ketoxime compounds. Examples of compounds of this class are disclosed in EP-A 0 724 197 and EP-A 0 860 741. Particular representatives of these compounds are ketoxime ethers corresponding to the following formula (VII)

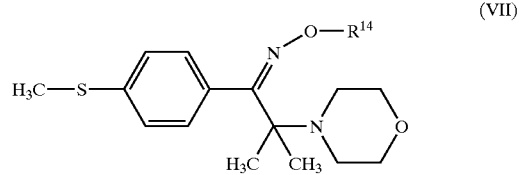

(VII)

wherein $R^{14}$ denotes an unsubstituted or substituted aliphatic, cycloaliphatic, aromatic or araliphatic radical. $R^{14}$ denotes for example $CH_2$—$CO_2CH_3$ or $CH_2$—(p)—$C_6H_4$—$CH=CH_2$. In general, the amount of ketoxime derivatives used as coinitiators ranges from 0.01 to 4.0% by weight, preferably from 0.05 to 1.0% by weight, with respect to the total weight of non-volatile matter of the photopolymerisable mixture.

Further suitable coinitiators are compounds based on aromatic ketones. Photoinitiators belonging to this class are described in the monography "Radiation Curing in Polymer Science and Technology" [1993] p. 77 to 117, authors: J. P. Founassier and J. F. Rabeck. Preferred examples of this class of coinitiators are unsubstituted and substituted benzophenones, α-hydroxyketones [in particular (1-hydroxycyclohexyl)phenyl ketones, also known as 1-benzoylcyclohexanol, and 1-[4-(2-hydroxyethoxy)-phenyl]-2-hydroxy-2-methylpropane-1-on], α-aminoketones [in particular 2-benzyl-2-dimethylamino-1-(4-morpholino-4-yl-phenyl)-butane-1-on and 2-methyl-1-(4-methylsulphonylphenyl)-2-morpholino-4-yl-propane-1-on], benzildialkyl ketals [in particular 2,2-dimethoxy-1,2-diphenylethane-1-on], acyl phosphines (in particular (2,4,6-trimethylbenzoyl)diphenyl-phosphine oxide and phenyl-bis-(2,4,6-trimethylbenzoyl)phosphine oxide.

In general, the amount of doinitiators based on aromatic ketones ranges from 0.01 to 4.0% by weight, preferably from 0.05 to 1.0% by weight, with respect to the total weight of non-volatile matter of the photopolymerisable mixture.

Borates can also be used as coinitiators. They generally correspond to the formula $[R^{15}R^{16}BR^{17}R^{18}]^-Z^+$. $Z^+$ represents therein a cation of an alkali metal or a quaternary ammonium cation. The radicals $R^{15}$ to $R^{18}$ represent independently an unsubstituted or substituted ($C_1$–$C_{16}$) alkyl group, an unsubstituted or substituted ($C_6$–$C_{14}$) aryl group or a ($C_7$–$C_{20}$) aralkyl group. Two of the radicals $R^{15}$ to $R^{18}$ may also be linked to one another. Borates which are suitable as initiators and processes for the preparation thereof are disclosed in DE-A 196 48 282. Particular representatives of borate coinitiators are trialkylammonium-alkyltriphenylborates, trialkylammonium-(alkylnaphthyldiphenylborates) and trialkylammonium-[alkyl-tris-(3-fluorophenyl)borates]. The amount of the borates generally ranges from 0.01 to 4.0% by weight, preferably from 0.05 to 1.0% by weight, relative to the total weight of the non-volatile components of the photopolymerisable mixture.

Also suitable, finally, are coinitiators based on hexaaryl-biimidazoles. These include: 2,4,5,2',4',5'-hexaphenyl-biimidazole, 2,2'-bis(2-chlorophenyl)-4,5,4',5'-tetraphenyl-biimidazole, 2,2'-bis(2-bromophenyl)-4,5,4',5'-tetraphenyl-biimidazole, 2,2'-bis(2,4-dichlorophenyl)-4,5,4',5'-tetraphenyl-biimidazole, 2,2'-bis(2-chlorophenyl)-4,5,4',5'-tetrakis(3-methoxyphenyl)-biimidazole, 2,2'-bis(2,6-dichloro-phenyl)-4,5,4',5'-tetraphenyl-biimidazole, 2,2'-bis(2-nitrophenyl)-4,5,4',5'-tetraphenyl-biimidazole, 2,2'-di-o-tolyl-4,5,4',5'-tetraphenyl-biimidazole and 2,2'-bis(2,6-difluorophenyl)-4,5,4',5'-tetraphenyl-biimidazole. The amount of hexaarylbiimidazole-based coinitiators generally ranges from 0.01 to 4.0% by weight, preferably from 0.05 to 1.0% by weight, relative to the total weight of the non-volatile components of the photopolymerisable mixture.

The amount of photoinitiators and coinitiators generally ranges from 0.05 to 5.0% by weight, preferably from 0.1 to 20.0% by weight, relative to the total weight of the non-volatile components of the photopolymerisable mixture.

In order to further adapt advantageously the properties of the photopolymerisable mixture according to the invention to the respective application purposes, the mixture can additionally contain further additives.

A further increase in the sensitivity of the mixture in the total visible spectral range can be achieved by adding a compound of the dibenzylidene acetone or coumarin type. Suitable representatives of these compounds are e.g. 4,4-bis(diethyl-amino)benzylidene acetone, 4,4'-dimethoxybenzylidene acetone and 3,4,3',4'-tetramethoxybenzylidene acetone. A suitable coumarin compound is e.g. 7-dialkylaminocoumarin, which may be 2-substituted or 3-substituted with an alkyl, an aryl or an heteroaryl group. An example of a substituted 7-dialkylamino-coumarin is 3-benzimidazole-2-yl-7-diethylaminocoumarin. Coumarins of this class are very efficient for a sensitisation up to wavelengths of about 500 nm. For a sensitisation above 500 nm ketocoumarins have proven particularly successful. Ketocoumarins include e.g. 3-acetyl-7-diethylaminocoumarin and carbonyl-bis(7-diethylaminocoumarin). Furthermore, the coumarin derivatives described in EP-A 747,771 and EP-A 704,765 can also be used. The amount of the compounds of the dibenzylidene acetone or coumarin type is generally in the range from 0.01 to 4.0% by weight, preferably 0.05 to 1.0% by weight with respect to the total weight of the non-volatile components in the mixture.

Eventually, the mixture according to the invention can contain additives as inhibitors for preventing thermal polymerisation. Furthermore, hydrogen donors, dyes, coloured and colourless pigments, colour formers, indicators, plasticisers and/or chain-transfer agents may be present. These additives are expediently selected so that they absorb as little as possible in the actinic range of the imagewise applied radiation.

The sensitivity of the mixture according to the present invention covers a wide wavelength range from about 250 nm to about 700 nm. The mixture is therefore not only suitable for imaging with visible light and longer-wave ultraviolet radiation, but also short-wave ultraviolet radiation, ultraviolet laser radiation (for example laser radiation having a wavelength of 266 nm), electron beam radiation and X-rays.

Eventually, it is also an object of the present invention to provide a recording material comprising a base and a photosensitive coating. For the production thereof the mixture according to the invention is effectively dissolved or dispersed in an organic solvent and thereupon the solution or dispersion obtained is applied as a thin film by curtain coating, spray coating, dip coating, roller coating or according to any similar process known to those skilled in the art. After drying, a recording material is obtained that can be used for the production of e.g. printing forms for letterpress printing, planographic printing, gravure printing and screen printing. The material may also be used for the production of relief copies, e.g. for the production of Braille texts, of individual copies, tanned images, pigmented images or similar imagewise structured products. In addition, the mixture according to the invention can be used for the production of etching resists, e.g. for the production of printed circuit boards or name tags, and for chemical milling. However, the mixture is preferably applied in the production of photoresist layers and of recording materials for planographic printing plates.

Suitable base materials for printing plates are sheetings, webs or plates made of metal, in particular of aluminium or an aluminium alloy, steel, zinc, copper, or made of plastic, in particular of polyester, especially poly(ethylene terephthalate) or cellulose acetate, and as screen-printing base also Perlon gauze. In many cases, it is advantageous to subject the surface of the base to a chemical and/or electrochemical pre-treatment, in order to optimise the adhesion of the photosensitive layer to the base or to reduce the reflectivity of the surface of the base in the actinic range of the imagewise applied radiation (antihalation). A preferred base for offset printing plates consists of aluminium or an aluminium alloy, the surface of which has been electrochemically grained, followed by an anodisation, and optionally by a treatment with an hydrophilising agent, e.g. poly (vinylphosphonic acid).

Thanks to the broad spectral sensitivity of the recording material according to the invention, the imagewise irradiation can be performed by means of almost any radiation source known to those skilled in the art, namely fluorescent tubes, pulsed xenon lamps, metal-halide-doped high-pressure mercury vapour lamps and carbon arc lamps.

The recording materials according to the invention used for the production of planographic printing plates can be imaged by contact imaging with light originating from common incandescent lamps or in conventional projectors and enlargers under the light of metal filament lamps. Exposure of the recording material can also be effected directly, i.e. without image original, by means of computer-controlled laser radiation. The lasers used therefor exhibit a predetermined minimum power. Suitable lasers are in particular argon ion lasers, krypton ion lasers, dye lasers, helium-cadmium lasers, helium-neon lasers and optionally frequency-doubled Nd:YAG lasers and diode lasers. The wavelength of the laser beams is generally between 250 and 650 nm.

The recording material according to the present invention has a particularly high imaging performance and is very well suited for digital imaging with laser beams. In the subsequent development process an exact differentiation between non-image areas and image areas is obtained, leading to a surprisingly strong decrease of dot gain. As a result, small negative types are reproduced clearly too. In addition, the material shows a very high sensitivity over a broad range of wavelengths.

It is generally favourable to keep the photosensitive layer away from the influence of atmospheric oxygen during the photochemically induced photopolymerisation. To that end, it is advisable to apply a suitable protective overcoat that is impermeable or but slightly permeable to oxygen (the expression "slightly permeable" means a permeability not greater than 100 cm$^3$ O$_2$/m$^2$·d·bar measured in accordance with DIN 53 380 at 23° C.) on top of the photosensitive layer. Such protective overcoat may be self-supporting and can be peeled off before the subsequent developing step. In that case the protective overcoat consists e.g. of a polyester film laminated to the photosensitive layer. The protective overcoats may also consist of a material which is soluble or dispersible in the developer solution, at least in the non-hardened areas. Materials suitable for a protective overcoat having full-area solubility (that is all-over soluble) in aqueous alkaline developers include e.g. poly(vinyl alcohol), polyvinylpyrrolidone, polyphosphates, sugars, etc. Such protective overcoats generally have a thickness of 0.1 to 10 μm, preferably of 1 to 5 μm.

The further processing of the imagewise exposed recording materials is carried out according to a common process known to those skilled in the art. To improve the crosslinking in the exposed areas, the imagewise exposed material may be post-heated before being developed. Development is carried out with organic solvents or mixtures thereof, but preferably with aqueous alkaline solutions having a pH in the range from 10–14, preferably from 11–13, and containing up to about 15% by weight, preferably up to 5% by weight of water-miscible organic solvents. In addition, the developers may contain wetting agents, dyes, salts and/or other additives. Upon development the unexposed parts of the layer are removed, whereas the exposed and thus hardened areas of the layer remain on the base.

The following examples illustrate the present invention. The designation (wt) stands for "part(s) by weight", the designation (vp) for "parts by volume". Percent are percent by weight, unless otherwise stated.

COMPARATIVE EXAMPLES 1 to 5

A Mixture Composed of:
2.88 wt of a methyl methacrylate/methacrylic acid copolymer having an average molecular weight M$_w$ of 25,000 (molar ratio of methyl methacrylate units to methacrylic acid units 4:1—acid number: 110),
4.72 wt of a monomer according to table 1,
0.28 wt of bis-($\eta^5$-cyclopentadienyl)-bis-(2,6-difluoro-3-pyrrol-1-yl-phenyl)titanium and
0.12 wt of Renol blue (C.I. 74 160) in 55.20 wt of propylene glycol monomethyl ether (®Dowanol PM) and 36.80 wt of butanone was spin-coated on a electrochemically roughened anodised (oxide layer weight: 3 g/m$^2$) aluminium printing plate base, which has been hydrophilised with polyvinylphosphonic acid, and dried. After drying (2 minutes at 100° C. in a circulating-air cabinet drier) the photosensitive coating showed a weight of 1.5 to 1.7 g/m$^2$. Thereupon, the photosensitive layer was coated with an aqueous solution of 10% polyvinyl alcohol (12% residual acetyl groups, K value 4) and again dried for 2 minutes at 100° C. in the circulating-air cabinet drier. The overcoat so obtained had a weight of 2.5 to 2.7 g/m$^2$. The total preparation process took place under red safelighting.

The recording material so obtained was then exposed image-wise in a ®Polaris 100 laser imagesetter from Agfa-Gevaert AG, which was equipped with a frequency-doubled Nd:YAG laser (emitting at 532 nm), through a 13-step exposure wedge having density increments ΔD=0.15 (UGRA offset test wedge). The exposure energy was selected so that, after development, 3 wedge steps of the continuous-tone step were hardened (a complete hardening of a continuous-tone step is achieved, when its densitometric optical density is 97% of the density of a solid of the printing plate, which has been exposed without filter. In this case, the densitometric measurements were carried out with a DC-19 densitometer from Gretag which was equipped with a magenta filter according to DIN 16536). The exposed printing plate was thereupon heated for 1 minute to 100° C. and thereupon developed using an aqueous-alkaline developer (®Ozasol EN 231C from Agfa-Gevaert AG) at 23° C. and a throughput speed of 1.0 m/min. in a VSC 82 processor from Technigraph.

Onto a similar recording material was then exposed with the above exposure energy at a resolution of 2,400 dpi (dots per inch) a digital control element with a 133 lpi (lines per inch) screen and a theoretical per cent dot area of 40% (DGPlateControl) using the font type 4 pt of a 4-pt negative type of the font "Times New Roman" without calibration of the imagesetter. After developing in the way described above, the dot gain on the printing plate in the screen control element was determined by effecting a densitometric measurement of the per cent dot area of the 40% screen element. The dot gain is indicated in the following tables as the deviation from the 40% per cent dot area. The number of characters in the negative font type which are not completely openly reproduced, was used for evaluating the reproduction quality. The photosensitivity of the printing plate was calculated from the laser energy set in the imagesetter, according to the following formula:

Photosensitivity [μJ/cm$^2$]5.1·laser energy+15

TABLE 1

| Ex. | Monomer | Photo-sensitivity | Dot gain | Number of characters not openly reproduced |
|---|---|---|---|---|
| 1 | Conversion product of 1 mole of hexamethylene isocyanate, 1 mole of 2-hydroxyethyl methacrylate and 0.5 mole of 2-(2-hydroxy-ethyl)piperidine | --)* | --)** | --)** |

TABLE 1-continued

| Ex. | Monomer | Photo-sensitivity | Dot gain | Number of characters not openly reproduced |
|---|---|---|---|---|
| 2 | triethylene glycol dimethacrylate | --)* | --)** | --)** |
| 3 | triethylene glycol diacrylate | --)* | --)** | --)** |
| 4 | trimethylol propane triacrylate | --)* | --)** | --)** |
| 5 | Conversion product of 1 mole of 2,2,4-trimethyl hexamethylene diisocyanate and 2 moles of 2-hydroxyethyl methacrylate | --)* | --)** | --)** |

)* an imagewise differentiation could not be achieved due to the limited sensitivity towards radiation of 532 nm as a result of the absence of the dye.
)** the sensitivity of the formulation was insufficient for imaging and as a result thereof the dot gain and the number of characters which have not been openly reproduced are not determinable.

COMPARATIVE EXAMPLES 6 to 10

Mixtures comprising only one monomer, which contains a photooxidisable group or not, a photoreducible dye and a triazine (see EP-A 0 364 735)

A Mixture Comprising 2.80 wt of a methyl methacrylate/methacrylic acid copolymer (as in the comparative examples 1 to 5), 4.64 wt of a monomer according to table 2, 0.16 wt of bis (η$^5$-cyclopentadienyl)-bis-(2,6-difluoro-3-pyrrol-1-yl-phenyl)titanium, 0.12 wt of Renol blue (C.I. 74160), 0.24 wt of eosine alcohol-soluble (C.I. 45 386) and 0.04 wt 2,4-bis-dichloromethyl-6-(4-styrylphenyl)-[1,3,5] triazine in 55.20 wt of propylene glycol monomethyl ether (®Dowanol PM) and 36.80 wt of butanone was spin-coated on the aluminium base material already described in the comparative examples 1 to 5 and dried.

The weight of the photosensitive layer was 1.5 g/m$^2$.

The imagewise exposure was carried out again as in the preceding comparative examples. Table 2 also gives the data about photosensitivity, dot gain and number of characters which have not been openly reproduced, for each of the printing plates thus prepared.

TABLE 2

| Ex. | Monomer | Photo-sensitivity μJ/cm$^2$ | Dot gain [%] | Number of characters not openly reproduced |
|---|---|---|---|---|
| 6 | Conversion product of 1 mole of hexamethylene isocyanate, 1 mole of 2-hydroxyethyl methacrylate and 0.5 mole of 2-(2-hydroxy-ethyl)piperidine | 66 | +29 | 11 |
| 7 | triethylene glycol dimethacrylate | 220 | +8 | 2 |
| 8 | triethylene glycol diacrylate | >530 | )** | )** |

TABLE 2-continued

| Ex. | Monomer | Photo-sensitivity $\mu J/cm^2$ | Dot gain [%] | Number of characters not openly reproduced |
|---|---|---|---|---|
| 9 | trimethylol propane triacrylate | >530 | )** | )** |
| 10 | Conversion product of 1 mole of 2,2,4-trimethyl hexamethylene diisocyanate and 2 moles of 2-hydroxyethyl methacrylate | 168 | +4 | 2 |

)**: for explanations see Table 1.

COMPARATIVE EXAMPLES 11 to 14

Mixtures comprising different amounts of one monomer, which contains a photooxidisable group or not, a photoreducible dye and a triazine (see EP-A 0 573 805).

A Mixture Comprising

X wt of a methyl methacrylate/methacrylic acid copolymer (as in the comparative examples 1 to 5),
y wt of a monomer according to table 3,
0.16 wt of bis-($\eta^5$-cyclopentadienyl)-bis-(2,6-difluoro-3-pyrrol-1-yl-phenyl)titanium,
0.12 wt of Renol blue (C.I. 74160),
0.04 wt of eosine alcohol-soluble (C.I. 45 386) and of 2,4-bis-dichloromethyl-6-(4-styrylphenyl)-[1,3,5]triazine in
55.20 wt of propylene glycol monomethyl ether (®Dowanol PM) and
36.80 wt of butanone
 was spin-coated on the aluminium base material already described in the comparative examples 1 to 5 and dried. The weight of the photosensitive layer was 1.5 g/m².

The imagewise exposure was performed again as in the preceding comparative examples. Table 3 also gives the data about photosensitivity, dot gain and number of characters which have not been openly reproduced, for each of the printing plates thus prepared.

TABLE 3

| Ex. | x wt of polymer | y wt of monomer | Monomer of example | Photo-sensitivity $\mu J/cm^2$ | Dot gain [%] | Number of characters not openly reproduced |
|---|---|---|---|---|---|---|
| 11 | 3.72 | 3.72 | 6 | 475 | +12 | 2 |
| 12 | 1.11 | 6.33 | 6 | 40 | +29 | 15 |
| 13 | 3.72 | 3.72 | 7 | 180 | +9 | 3 |
| 14 | 1.11 | 6.33 | 7 | >530 | -)** | --)** |

)**: for explanations see table 1.

COMPARATIVE EXAMPLES 15 and 16

Photosensitive mixtures comprising only one monomer (which contains photooxidisable groups), a photoreducible dye, a triazine and a titanocene (see EP-A 0 445 624).

A Mixture Comprising 2,80 wt of a methyl methacrylate/methacrylic acid copolymer (as in the comparative examples 1 to 5),
4,64 wt of a conversion product of 1 mole of hexamethylene isocyanate, 1 mole of 2-hydroxyethyl methacrylate and 0.5 mole of 2-(2-hydroxyethyl)piperidine
0.16 wt of the titanocene according to table 4,
0.12 wt of Renol blue (C.I. 74160),
0.24 wt of eosine alcohol-soluble (C.I. 45 386) and
0.04 wt of 2,4-bis-dichloromethyl-6-(4-styrylphenyl)-[1,3,5]triazine in
55.20 wt of propylene glycol monomethyl ether (®Dowanol PM) and
36.80 wt of butanone
 was spin-coated on the aluminium base material already described in the comparative examples 1 to 6 and dried. The weight of the photosensitive layer was 1.5 g/m².

The imagewise exposure was performed again as in the preceding comparative examples. Table 4 also gives the data about photosensitivity, dot gain and number of characters which have not been openly reproduced, for each of the printing plates thus prepared.

TABLE 4

| Ex. | Photoinitiator | Photo-sensitivity $\mu J/cm^2$ | Dot gain [%] | Number of characters not openly reproduced |
|---|---|---|---|---|
| 15 | bis-($\eta^5$-cyclopentadienyl)-bis-(2,4,6-trifluorophenyl) titanium | 71 | +27 | 10 |
| 16 | bis-($\eta^5$-cyclopentadienyl)-bis-(pentafluorophenyl) titanium | 61 | +28 | 11 |

EXAMPLES 17 to 21 (INVENTION)

A Mixture Comprising 2.80 wt of a methyl methacrylate/methacrylic acid copolymer (as in the comparative examples 1 to 5),
x wt of a monomer containing photooxidisable groups, according to example 2,
y wt of a polyethylene glycol diacrylate or dimethacrylate according to table 5 (monomer 2), wherein x+y=4.64 wt,
0.16 wt bis-($\eta^5$-cyclopentadienyl)-bis-(2,6-difluoro-3-pyrrol-1-yl-phenyl)titanium,
0.12 wt of Renol blue (C.I. 74160),
0.24 wt of eosine alcohol-soluble (C.I. 45 386) and
0.04 wt of 2,4-bis-dichloromethyl-6-(4-styrylphenyl)-[1,3,5]triazine in
55.20 wt of propylene glycol monomethyl ether (®Dowanol PM) and
36.80 wt of butanone
 was spin-coated on the aluminium base material already described in the comparative examples 1 to 5 and dried. The weight of the photosensitive layer is 1.5 g/m².

The imagewise exposure was carried out again as in the preceding comparative examples. Table 5 also gives the data about photosensitivity, dot gain and number of characters which have not been openly reproduced, for each of the printing plates thus prepared.

TABLE 5

| Ex. | x wt of monomer 1 | y wt of monomer 2 | Monomer of example | Photo-sensitivity $\mu J/cm^2$ | Dot gain [%] | Number of characters not openly reproduced |
|---|---|---|---|---|---|---|
| 17 | 4.18 | 0.46 | TGD* | 66 | 8 | 1 |
| 18 | 3.48 | 1.16 | TGD* | 66 | 7 | 0 |
| 19 | 2.32 | 2.32 | TGD* | 66 | 5 | 0 |

TABLE 5-continued

| Ex. | x wt of monomer 1 | y wt of monomer 2 | Monomer of example | Photosensitivity µJ/cm² | Dot gain [%] | Number of characters not openly reproduced |
|---|---|---|---|---|---|---|
| 20 | 3.48 | 1.16 | PG2** | 56 | 12 | 2 |
| 21 | 3.48 | 1.16 | PG4*** | 86 | 18 | 4 |

*TGD = triethylene glycol dimethacrylate
**PG2 = polyethylene glycol-200-dimethacrylate
**PG4 = polyethylene glycol-400-dimethacrylate.

What is claimed is:

1. Photopolymerizable mixture comprising
a polymer binder,
a radically photopolymerizable component,
a photoreducible dye and a metallocene,
characterised in that
the photopolymerizable component contains at least one polymerizable compound possessing at least one photooxidizable group and at least one polyethylene glycol di(meth) acrylate containing 2 or more ethylene glycol units, and
the metallocene is of the formula (V)

wherein
Me represents titanium or zirconium
$R^4$ and $R^5$ represent cyclopentadienyl radicals which is optionally substituted identically or differently, and
$R^6$ and $R^7$ represent (2,6-difluoro-3-pyrrol-1-yl-phenyl).

2. Photopolymerizable mixture according to claim 1, characterised in that the polyethylene glycol di(meth) acrylate contains 3 to 5 ethylene glycol units.

3. The photopolymerizable mixture according to claim 2, wherein the amount of polyethylene glycol di(meth) acrylate ranges from 10 to 65% by weight relative to the total weight of the non-volatile components of the mixture.

4. Photopolymerizable mixture according to claim 1, wherein the amount of polyethylene glycol di(meth)acrylate ranges from 5 to 75% by weight, relative to the total weight of the non-volatile components of the mixture.

5. Photopolymerizable mixture according to claim 1, wherein the mixture contains at least one additional photoinitiator.

6. Photopolymerizable mixture according to claim 5, wherein the additional photoinitiator is a compound containing at least one trihalomethyl group that can be cleaved photolytically.

7. The photopolymerizable mixture according to claim 6, wherein said at least one trihalomethyl group is a trichloromethyl or a tribromomethyl group.

8. Photopolymerizable mixture according to claim 6, characterised in that the polyethylene glycol di(meth) acrylate contains 3 to 5 ethylene glycol units and the amount of polyethylene glycol di(meth)acrylate ranges from 5 to 75% by weight,
relative to the total weight of the non-volatile components of the mixture and the metallocene is bis(η5-cyclopentadienyl)-bis-(2,6-difluoro-3-pyrrol-1-yl-phenyl)titanium.

9. Photopolymerizable mixture according to claim 1, wherein the amount of metallocene(s) ranges from 0.01 to 20% by weight relative to the total weight of the non-volatile components of the photopolymerizable mixture.

10. The photopolymerizable mixture according to claim 9, wherein the metallocene ranges from 0.05 to 12% by weight relative to the total weight of the non-volatile components of the photopolymerizable mixture.

11. Photopolymerizable mixture according to claim 1, wherein the amount of the photopolymerizable compound containing photooxidizable groups ranges from 5 to 75% by weight relative to the total weight of the non-volatile components of the mixture.

12. The photopolymerizable mixture according to claim 11 on the amount of photopolymerizable compound containing photooxidizable groups range from 10 to 65% by weight, relative to the total weight of the non-volatile components of the mixture.

13. Photopolymerizable mixture according to claim 1, wherein the photoreducible dye is an eosine dye.

14. Recording material comprising a base and a photosensitive photopolymerizable layer, which contains the photopolymerizable mixture as defined according to claim 1.

15. Recording material according to claim 14, wherein the photopolymerizable layer is coated with an overcoat showing a thickness between 0.1 and 10 µm.

16. Recording material according to claim 15, wherein the overcoat is made of a material which at least in the non-hardened areas is soluble or dispersible in the developer liquid.

17. The recording material according to claim 15, wherein the photopolymerizable layer is coated with an overcoat showing a thickness between 1 and 5 µm.

18. Recording material according to claim 14, wherein the base is a foil, a web or a plate made of metal or made of plastic.

19. The recording material according to claim 18, wherein said metal is aluminum, aluminum alloy, steel, zinc or copper and said plastic is polyester.

20. The photopolymerizable mixture according to claim 1, the metallocene is bis(η5-cyclopentadienyl)-bis-(2,6-difluoro-3-pyrrol-1-yl-phenyl)titanium.

21. A recording material comprising a base and a photosensitive photopolymerizable layer, which contains the photopolymerizable mixture as according to claim 20.

* * * * *